(12) United States Patent
Kim et al.

(10) Patent No.: US 10,707,447 B2
(45) Date of Patent: Jul. 7, 2020

(54) ORGANIC LIGHT-EMITTING DISPLAY DEVICE

(71) Applicant: Samsung Display Co., Ltd., Yongin-si, Gyeonggi-do (KR)

(72) Inventors: Suk Kim, Hwaseong-si (KR); Gee Bum Kim, Seoul (KR); Sung Kook Park, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/003,873

(22) Filed: Jun. 8, 2018

(65) Prior Publication Data

US 2019/0221778 A1    Jul. 18, 2019

(30) Foreign Application Priority Data

Jan. 15, 2018 (KR) .................. 10-2018-0005075

(51) Int. Cl.
| | |
|---|---|
| *H01L 35/24* | (2006.01) |
| *H01L 51/00* | (2006.01) |
| *H01L 51/52* | (2006.01) |
| *H01L 27/32* | (2006.01) |

(52) U.S. Cl.
CPC ...... *H01L 51/5275* (2013.01); *H01L 27/3216* (2013.01); *H01L 27/3246* (2013.01); *H01L 27/3218* (2013.01); *H01L 51/5209* (2013.01)

(58) Field of Classification Search
CPC ............ H01L 27/3274; H01L 27/3204; H01L 27/3246; H01L 27/3248; H01L 27/3258; H01L 51/50; H01L 51/502; H01L 51/5036; H01L 51/5278
USPC ......................................................... 257/40
See application file for complete search history.

(56) References Cited

U.S. PATENT DOCUMENTS

| | | | | |
|---|---|---|---|---|
| 7,468,765 | B2 * | 12/2008 | Shiota ............... | G02F 1/133345 349/110 |
| 2009/0242911 | A1 * | 10/2009 | Ishihara ............. | H01L 27/3211 257/89 |
| 2011/0006327 | A1 * | 1/2011 | Park ................... | H01L 27/3213 257/98 |
| 2015/0090991 | A1 * | 4/2015 | Ishii ................... | H01L 51/525 257/40 |

FOREIGN PATENT DOCUMENTS

| KR | 10-2010-0073228 | 7/2010 |
|---|---|---|
| KR | 10-2015-0076070 | 7/2015 |

* cited by examiner

*Primary Examiner* — Theresa T Doan
(74) *Attorney, Agent, or Firm* — Lewis Roca Rothgerber Christie LLP

(57) ABSTRACT

An organic light-emitting display device includes: a substrate; a first organic light-emitting layer disposed on the substrate; a pixel defining film disposed on the first organic light-emitting layer and having a first opening, which at least partially exposes the first organic light-emitting layer; and an optical path converter disposed on the pixel defining film to overlap with the first organic light-emitting layer and including a first optical path converting member, which has a first refractive index, and a second optical path converting member, which has a second refractive index that is lower than the first refractive index.

20 Claims, 12 Drawing Sheets

ORGANIC LIGHT-EMITTING DISPLAY DEVICE

CROSS-REFERENCE TO RELATED APPLICATION

This application claims priority to and the benefit of Korean Patent Application No. 10-2018-0005075, filed on Jan. 15, 2018, in the Korean Intellectual Property Office, the disclosure of which is incorporated herein by reference in its entirety.

BACKGROUND

1. Field

The present disclosure relates to an organic light-emitting display device.

2. Description of the Related Art

Display devices have become increasingly important in accordance with developments in multimedia technology. Accordingly, various display devices (e.g., various types of display devices), such as liquid crystal display (LCD) devices, organic light-emitting display devices, etc., have been utilized.

The organic light-emitting display device displays an image utilizing light-emitting diodes (OLEDs), which generate light through the recombination of electrons and holes. The organic light-emitting display device has many enhancements, such as fast response speed, high luminance, wide viewing angle, and low power consumption.

SUMMARY

An aspect according to one or more exemplary embodiments of the present disclosure is directed toward an organic light-emitting display device capable of improving emission efficiency.

An aspect according to one or more exemplary embodiments of the present disclosure is also directed toward an organic light-emitting display device capable of enlarging an emission area.

However, exemplary embodiments of the present disclosure are not restricted to those set forth herein. The above and other exemplary embodiments of the present disclosure will become more apparent to one of ordinary skill in the art to which the present disclosure pertains by referencing the detailed description of the present disclosure given below.

According to an embodiment of the inventive concept, an organic light-emitting display device includes: a substrate; a first organic light-emitting layer on the substrate; a pixel defining film on the first organic light-emitting layer and having a first opening that at least partially exposing the first organic light-emitting layer; and an optical path converter on the pixel defining film and overlapping with the first organic light-emitting layer, the optical path converter including a first optical path converting member having a first refractive index and a second optical path converting member having a second refractive index that is lower than the first refractive index. The first optical path converting member has a first surface, a second surface opposing the first surface of the first optical path converting member and being shorter than the first surface of the first optical path converting member, a first side surface connecting a first side of the first surface and a first side of the second surface of the first optical path converting member, and a second side surface connecting a second side of the first surface and a second side of the second surface of the first optical path converting member. The second optical path converting member surrounds the first and second side surfaces of the first optical path converting member, and a length of the second surface of the first optical path converting member is greater than a length of the first opening of the pixel defining film.

According to an embodiment of the inventive concept, an organic light-emitting display device includes: a substrate; an organic light-emitting layer on the substrate; a pixel defining film on the organic light-emitting layer and having a first opening that at least partially exposes the organic light-emitting layer; and an optical path converter on the pixel defining film and overlapping with the first organic light-emitting layer, the optical path converter including a first optical path converting member having a trapezoidal cross-sectional shape and a second optical path converting member surrounding side surfaces of the first optical path converting member. A refractive index of the first optical path converting member is higher than a refractive index of the second optical path converting member, and a length of a top surface of the first optical path converting member is greater than a length of the first opening of the pixel defining film.

According to the aforementioned and other exemplary embodiments of the present disclosure, emission efficiency can be improved.

In addition, an emission area of an organic light-emitting display device can be enlarged.

Other features and exemplary embodiments may be apparent from the following detailed description, the accompanying drawings, and the claims.

BRIEF DESCRIPTION OF THE DRAWINGS

The above and other exemplary embodiments and features of the present disclosure will become more apparent by describing in more detail exemplary embodiments thereof with reference to the attached drawings, in which.

DETAILED DESCRIPTION

Figure 1:
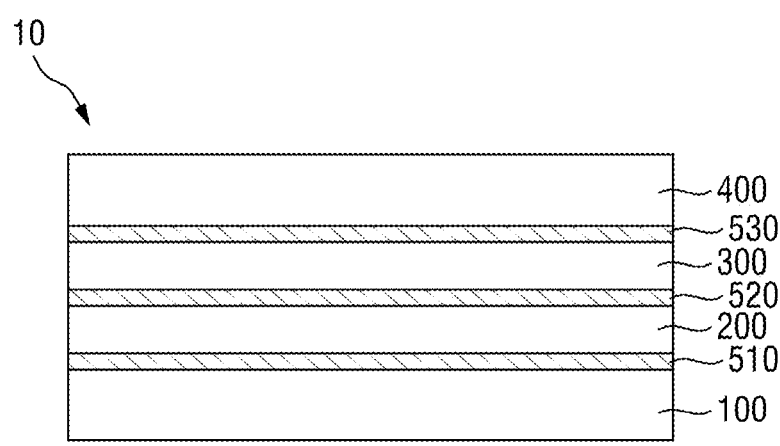
FIG. 1 is a schematic cross-sectional view of an organic light-emitting display device according to an exemplary embodiment of the present disclosure.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram forms in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for example, XYZ, XYY, YZ, and ZZ. Like reference numbers refer to like elements throughout. As used herein, the term "and/or" includes any and all combinations of one or more of the associated listed items.

Although the terms "first," "second," etc., may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, exemplary embodiments will be described with reference to the accompanying drawings.

FIG. 1 is a schematic cross-sectional view of an organic light-emitting display device according to an exemplary embodiment of the present disclosure.

Referring to FIG. 1, an organic light-emitting display device 10 may include a display panel 100, an input sensing panel 200, an anti-reflection panel 300, and a window panel 400. An element coupled to another element via an adhesive member will hereinafter be referred to as a panel, and an element formed together with another element by a continuous process will hereinafter be referred to as a layer. A "panel" may include a base layer that provides a base surface, whereas a "layer" has no base layer. That is, a "layer" refers to an element disposed on a base surface provided by another element. In one exemplary embodiment, a base layer may be a single-layer film (such as a synthetic resin film or a composite film), or a multilayer film having a stack of a plurality of films. The base layer may include a glass substrate.

The display panel 100 is defined as a panel displaying an image. The display panel 100 includes a plurality of display elements. The plurality of display elements may be organic light-emitting diodes (OLEDs).

The input sensing panel 200 may be disposed on the display panel 100. In one exemplary embodiment, the input sensing panel 200 may be coupled to the display panel 100 via a first adhesive member 510. In one exemplary embodiment, the input sensing panel 200 may sense a finger of the user or a touch pen that is placed in contact therewith. In another exemplary embodiment, the input sensing panel 200 may sense pressure applied to the organic light-emitting display device 10.

The anti-reflection panel 300 may be disposed on the input sensing panel 200. In one exemplary embodiment, the anti-reflection panel 300 may be coupled to the input sensing panel 200 via a second adhesive member 520. The anti-reflection panel 300 may reduce the reflectance of external light incident thereupon from above the window panel 400. In one exemplary embodiment, the anti-reflection panel 300 may include a retarder and a polarizer. The anti-reflection panel 300 may further include a black matrix and color filters.

The window panel 400 may protect the display panel 100 or the input sensing panel 200 from being scratched. The window panel 400 may be disposed on the anti-reflection panel 300 and may be coupled to the anti-reflection panel 300 via a third adhesive member 530.

The first, second, and third adhesive members 510, 520, and 530 may be pressure sensitive adhesives (PSAs), optically clear adhesives (OCAs), or optically clear resins (OCRs).

Alternatively to what is shown in FIG. 1, the input sensing panel 200 may be disposed on the anti-reflection panel 300, and at least one of the input sensing panel 200 and the anti-reflection panel 300 may be formed as a layer or layers. For example, the input sensing panel 200 may be formed directly on the display panel 100 without the aid of an adhesive member, and/or a pressure sensing layer may be formed directly on the input sensing panel 200 without the aid of an adhesive member.

The display panel 100 will hereinafter be described with reference to FIGS. 2 and 3.

Figure 2:
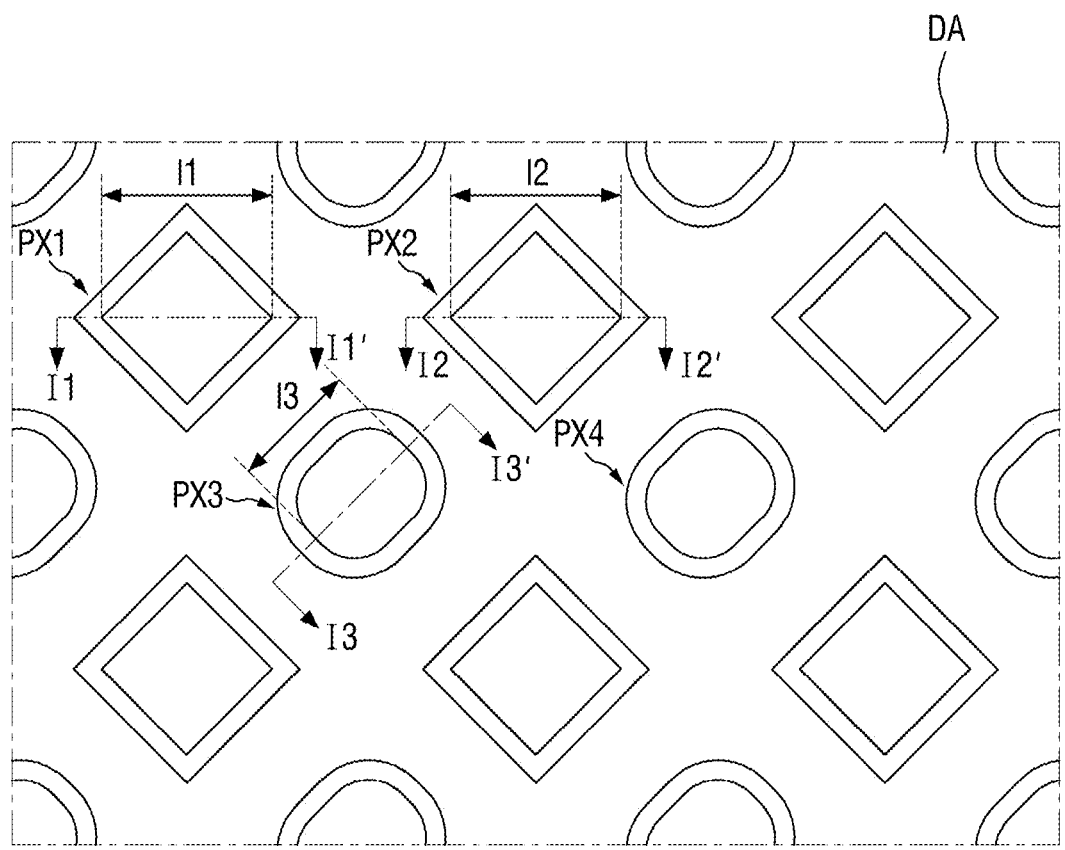
FIG. 2 is a schematic plan view of a pixel area of a display panel illustrated in FIG. 1.
Figure 2:
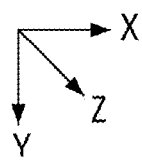

FIG. 2 is a schematic plan view of a pixel area of a display panel illustrated in FIG. 1. FIG. 3 is a schematic cross-sectional view taken along lines l1-l1', l2-l2', and l3-l3' of FIG. 2. Specifically, FIG. 2 illustrates pixel electrodes and a plurality of openings of a pixel defining film.

The display panel 100 may include a plurality of pixel units, and the plurality of pixel units include first, second, third, and fourth pixel units PX1, PX2, PX3, and PX4, which are disposed in the display area DA. The plurality of pixel units will hereinafter be described, taking the first, second, third, and fourth pixel units PX1, PX2, PX3, and PX4 as an example.

The first pixel unit PX1 may be disposed adjacent to the second pixel unit PX2 in a first direction X. The third pixel unit PX3 may be arranged in a different row from the first and second pixel units PX1 and PX2 and may be disposed adjacent to the first and second pixel units PX1 and PX2 in a third direction Z, which is a diagonal direction (e.g., forms a 45 degree angle) with respect to the first direction X and a second direction Y. The fourth pixel unit PX4 may be disposed adjacent to the third pixel unit PX3 in the first direction X.

In one exemplary embodiment, the first pixel unit PX1 may display a red color, the second pixel unit PX2 may display a blue color, and the third and fourth pixel units PX3 and PX4 may display a green color. That is, the first, second, third, and fourth pixel units PX1, PX2, PX3, and PX4 may be arranged in the display area DA in an RGBG pentile manner. However, the arrangement of the plurality of pixel units in the display area DA is not particularly limited. For example, the arrangement of the plurality of pixel units may vary depending on the colors displayed by the plurality of pixel units and the resolution and the aperture ratio of an organic light-emitting display device to which the plurality of pixel units are applied.

The elements of the display panel 100 will hereinafter be described with reference to FIG. 3.

Figure 3:
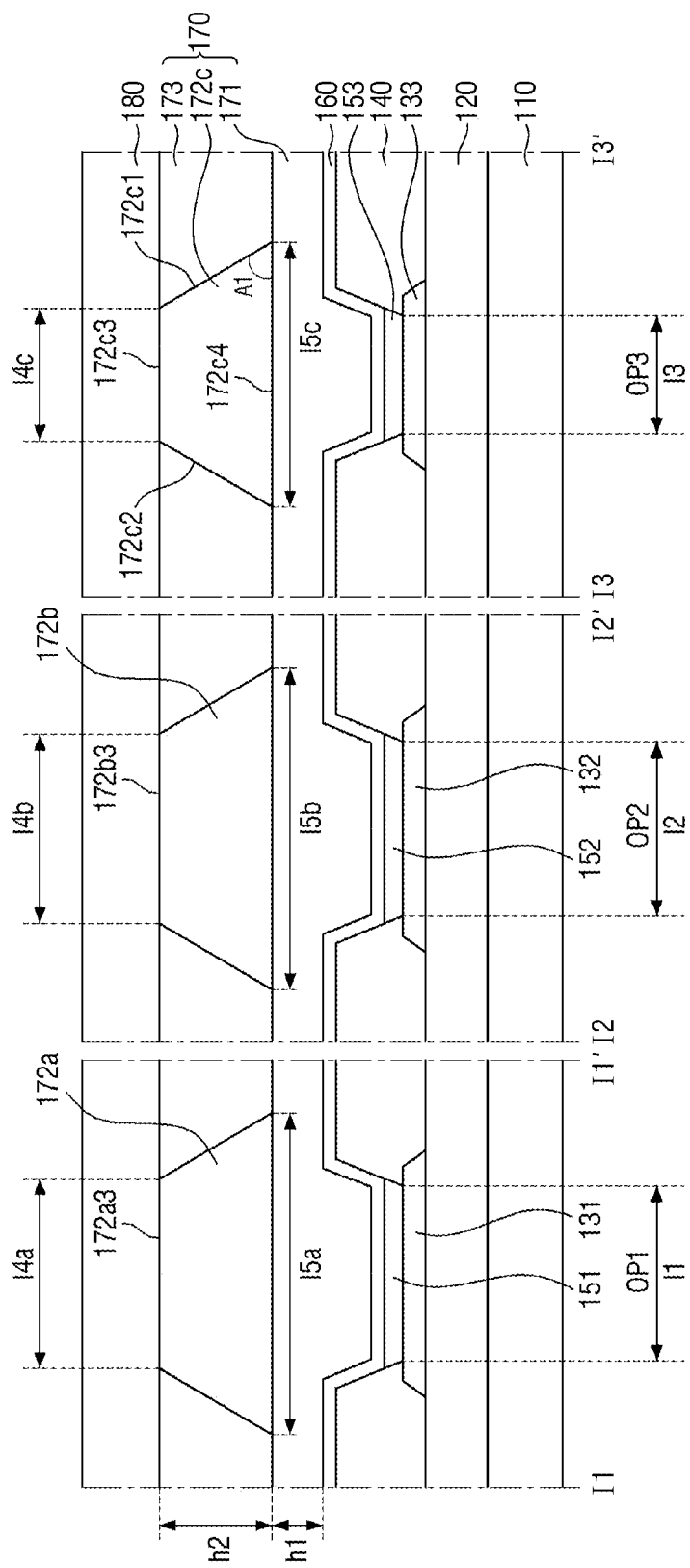
FIG. 3 is a schematic cross-sectional view taken along lines 11-11', 12-12', and 13-13' of FIG. 2.

Referring to FIGS. 2 and 3, the display panel 100 may include a substrate 110, a conductive layer 120, a plurality of pixel electrodes, including first, second, and third pixel electrodes 131, 132, and 133, a pixel defining film 140, a plurality of organic light-emitting layers, including first, second, and third organic light-emitting layers 151, 152, and 153, a common electrode 160, an optical path converter 170, and a first encapsulation layer 180.

The substrate 110 may be an insulating substrate. In one exemplary embodiment, the substrate 110 may include a material such as glass, quartz, or a polymer resin. The polymer resin may be polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylatepolycarbonate (PC), cellulose triacetate (CAT), cellulose acetate propionate (CAP), or a combination thereof.

In another exemplary embodiment, the substrate 110 may be a flexible substrate including polyimide (PI) or may have a stack of a plurality of films.

The conductive layer 120 may be disposed on the substrate 110. FIG. 3 schematically illustrates the conductive layer 120 as a layer in which a buffer layer, a plurality of conductive wires, an insulating layer, and a plurality of thin-film transistors (TFTs) are disposed.

The plurality of TFTs may utilize amorphous silicon, polysilicon, low-temperature polysilicon (LTPS), an oxide semiconductor, an organic semiconductor, or the like as their channel layer. The plurality of TFTs may have different (e.g., different types of) channel layers. In one exemplary embodiment, a TFT including an oxide semiconductor and a TFT including LTPS may both be included in a single pixel unit in consideration of the functions of the TFTs or the order of processing.

The plurality of pixel electrodes will hereinafter be described, taking the first pixel electrode 131 as an example. The first pixel electrode 131 may be disposed on the conductive layer 120. In one exemplary embodiment, the first pixel electrode 131 may be an anode electrode. When the first pixel electrode 131 is an anode electrode, the plurality of pixel electrodes may be transparent or translucent electrodes or may be formed of a reflective material (such as aluminum (Al), silver (Ag), chromium (Cr), or an alloy thereof). The transparent or translucent electrodes may include at least one selected from the group consisting of indium tin oxide (ITO), indium zinc oxide (IZO), zinc oxide (ZnO), indium oxide ($In_2O_3$), indium gallium oxide (IGO), and aluminum-doped zinc oxide (AZO). The reflective material may include at least one selected from the group consisting of Ag, magnesium (Mg), chromium (Cr), gold (Au), platinum (Pt), nickel (Ni), copper (Cu), tungsten (W), and Al.

In one exemplary embodiment, the first pixel electrode 131 may be formed as a single film, but the present disclosure is not limited thereto. That is, the first pixel electrode 131 may be formed as a multilayer film having a stack of two or more materials. When the first pixel electrode 131 is formed as a multilayer film, the first pixel electrode 131 may include a reflective film and a transparent or translucent electrode disposed on the reflective film. In another exemplary embodiment, the first pixel electrode 131 may include a reflective film and a transparent or translucent electrode disposed below the reflective film. For example, the first pixel electrode 131 may have a triple-layer structure of ITO/Ag/ITO, but the present disclosure is not limited thereto.

The shape of the plurality of pixel electrodes is not particularly limited. The plurality of pixels may have different shapes and sizes.

In one exemplary embodiment, the first pixel electrode 131 may have a rhombus shape. As used herein, the term "rhombus shape" not only includes a shape that is perfectly rhombic, but also includes a shape that is substantially rhombic, in consideration of processing conditions. In one exemplary embodiment, the third pixel electrode 133 may have an elliptical shape. As used herein, the term "elliptical shape" not only includes a shape that is perfectly elliptical, but also includes a shape that is substantially elliptical (such as a polygonal shape), in consideration of processing conditions. The third pixel electrode 133 may be smaller in size than the first and second pixel electrodes 131 and 132, but the present disclosure is not limited thereto. Alternatively, the first, second, and third pixel electrodes 131, 132, and 133 may have different sizes.

The pixel defining film 140 may be disposed on the plurality of pixel electrodes. The pixel defining film 140 may include a plurality of openings, which at least partially expose the plurality of pixel electrodes. For example, first, second, and third openings OP1, OP2, and OP3 of the pixel defining film 140 at least partially expose the first, second, and third pixel electrodes 131, 132, and 133.

The pixel defining film 140 may include an organic material or an inorganic material. In one exemplary embodiment, the pixel defining layer 360 may include a material such as photoresist, a PI resin, an acrylic resin, a silicon compound, or a polyacrylic resin.

The plurality of organic light-emitting layers may be disposed on the plurality of pixel electrodes and on the pixel defining film 140. In one exemplary embodiment, the plurality of organic light-emitting layers may emit one of red light, blue light, and green light. In another exemplary embodiment, the plurality of organic light-emitting layers may emit white light or one of cyan light, magenta light, and yellow light. When the plurality of organic light-emitting layers emit white light, the plurality of organic light-emitting layers may include a white-light-emitting material or may have a stack of a red-light-emitting layer, a green-light-emitting layer, and a blue-light-emitting layer.

An example in which the first, second, and third organic light-emitting layers 151, 152, and 153 emit red light, blue light, and green light, respectively, will hereinafter be described. In one exemplary embodiment, the first, second, and third organic light-emitting layers 151, 152, and 153 may at least partially cover the sidewalls of the pixel defining film 140.

The plurality of openings of the pixel defining film 140 may have different lengths depending on the colors displayed by the organic light-emitting layers that they overlap with. The plurality of openings of the pixel defining film 140 will hereinafter be described, taking the first, second, and third openings OP1, OP2, and OP3 as an example. The plurality of organic light-emitting layers will hereinafter be described, taking the first, second, and third organic light-emitting layers 151, 152, and 153 as an example.

Because the organic light-emitting layers that the first, second, and third openings OP1, OP2, and OP3 of the pixel defining film 140 overlap with display different colors, lengths l1, l2, and l3 of the first, second, and third openings OP1, OP2, and OP3 may differ from one another. In one exemplary embodiment, the length l3 of the third opening OP3, which overlaps with the third organic light-emitting layer 153 displaying a green color, may be smaller than the lengths l1 and l2 of the first and second openings OP1 and OP2, and this will be described in more detail later along with the optical path converter 170.

The common electrode 160 may be disposed on the plurality of organic light-emitting layers and on the pixel defining film 140. In one exemplary embodiment, the common electrode 160 may be a cathode electrode. In one exemplary embodiment, the common electrode 160 may include at least one selected from the group consisting of lithium (Li), calcium (Ca), lithium fluoride/calcium (LiF/Ca), lithium fluoride/aluminum (LiF/Al), Al, Ag, and Mg. Also, the common electrode 160 may be formed of a material having a low work function. In one exemplary embodiment, the common electrode 160 may be a transparent or translucent electrode including at least one selected from the group consisting of ITO, IZO, ZnO, $In_2O_3$, IGO, and AZO.

The plurality of pixel electrodes, the plurality of organic light-emitting layers, and the common electrode 160 may form a plurality of organic light-emitting diodes (OLEDs). Although not specifically illustrated, the plurality of OLEDs may further include a hole transport layer, a hole injection layer, an electron transport layer, and an electron injection layer.

The optical path converter 170 may be disposed on the path of light emitted from the plurality of organic light-emitting layers.

In one exemplary embodiment, the optical path converter 170 may include a planarization layer 171, a plurality of first optical path converting members, and a second optical path converting member 173. The plurality of first optical path converting members will hereinafter be described, taking, as an example, first optical path converting members 172a, 172b, and 172c that overlap with the first, second, and third organic light-emitting layers 151, 152, and 153, respectively.

The planarization layer 171 may be disposed on the common electrode 160. The planarization layer 171 may be formed on the entire surface of the common electrode 160. The planarization layer 171 may provide flatness to the first optical path converting members 172a, 172b, and 172c.

Also, the planarization layer 171 may change the path of light emitted from the third organic light-emitting layer 153 and may thus provide the light to the first optical path converting members 172a, 172b, and 172c. The refractive index of the planarization layer 171 may be equal to, or higher than, the refractive index of the first optical path converting members 172a, 172b, and 172c. In one exemplary embodiment, the refractive index of the planarization layer 171 may be about 1.5 to 1.9.

The material of the planarization layer 171 is not particularly limited as long as the refractive index of the planarization layer 171 is equal to or higher than the refractive index of the first optical path converting members 172a, 172b, and 172c. In one exemplary embodiment, the planarization layer 171 may be an inorganic layer. When the planarization layer 171 is an inorganic layer, the planarization layer 171 may include at least one selected from the group consisting of silicon oxide (SiOx), silicon nitride (SiNx), and silicon oxynitride (SiONx). Also, when the planarization layer 171 is an inorganic layer, the planarization layer 171 may also serve as a passivation layer for protecting the plurality of organic light-emitting layers.

In another exemplary embodiment, the planarization layer 171 may be an organic layer. When the planarization layer 171 is an organic layer, the planarization layer 171 may include at least one of an acrylic resin, a methacrylic resin, polyisoprene, a vinyl resin, an epoxy resin, a urethane resin, a cellulose resin, a siloxane resin, a PI resin, a polyamide resin, and a perylene resin. Also, when the planarization layer 171 is an organic layer, an additional passivation layer may be further disposed between the planarization layer 171 and the common electrode 160 in order to prevent or substantially prevent the planarization layer 171 from being placed in direct contact with the common electrode 160. In this case, the passivation layer may be formed as an inorganic layer.

A height h1 of the planarization layer 171 is not particularly limited as long as the planarization layer 171 can provide sufficient flatness to the first optical path converting members 172a, 172b, and 172c and can change the path of light emitted from the third organic light-emitting layer 153 so that the light can be provided to the first optical path converting member 172c.

Alternatively to what is shown in FIG. 3, the planarization layer 171 may be formed to have a multilayer structure.

The first optical path converting members 172a, 172b, and 172c may be disposed on the planarization layer 171. The first optical path converting members 172a, 172b, and 172c may be formed to have a trapezoidal cross-sectional shape. As used herein, the term "trapezoidal shape" not only includes a shape that is perfectly trapezoidal, but also includes a shape that is substantially trapezoidal, in consideration of processing conditions. The first optical path converting members 172a, 172b, and 172c will hereinafter be described, taking, as an example, the first optical path converting member 172c overlapping with the third organic light-emitting layer 153.

The first optical path converting member 172c may have a first side surface 172c1, a second side surface 172c2, a top surface 172c3, and a bottom surface 172c4. The first side surface 172c1 may have a first angle A1 and may connect one side of the top surface 172c3 and one side of the bottom surface 172c4. The second side surface 172c2 may connect the other side of the top surface 172c3 and the other side of the bottom surface 172c4. In one exemplary embodiment, the second side surface 172c2 may be formed to be symmetrical with the first side surface 172c1, but the present disclosure is not limited thereto.

The top surface 172c3 and the bottom surface 172c4 of the first optical path converting member 172c face each other. A length l4c of the top surface 172c3 is smaller than a length l5c of the bottom surface 172c4.

The length l4 of the top surface 172c3 of the first optical path converting member 172c may be greater than the length l3 of the third opening OP3 of the pixel defining film 140, and this means that the third opening OP3 of the pixel defining film 140 may completely overlap with the top surface 172c3 of the first optical path converting member 172c in a vertical direction with respect to the substrate 110. Accordingly, a pair of opposing sides of the third organic light-emitting layer 153 may both fall within (e.g., be covered by) the top surface 172c3 of the first optical path converting member 172c, and this will be described later with reference to FIG. 4.

As already mentioned above, the lengths l1, l2, and l3 of the first, second, and third openings OP1, OP2, and OP3 may all differ from one another depending on the colors displayed by the first, second, and third organic light-emitting layers 151, 152, and 153.

Accordingly, a length l4a of a top surface 172a3 of the first optical path converting member 172a, a length l4b of a top surface 172b3 of the first optical path converting member 172b, and the length l4c of the top surface 172c3 of the first optical path converting member 172c may all differ from one another. In one exemplary embodiment, the length l4c of the top surface 172c3 of the first optical path converting member 172c may be smaller than the lengths l4a and l4b of the top surfaces 172a3 and 172b3 of the first optical path converting members 172a and 172b.

The refractive index of the first optical path converting members 172a, 172b, and 172c may be higher than the refractive index of the second optical path converting member 173. In one exemplary embodiment, the refractive index of the first optical path converting members 172a, 172b, and 172c may be about 1.5 to 1.9. The material of the first optical path converting members 172a, 172b, and 172c is not particularly limited as long as the refractive index of the first optical path converting members 172a, 172b, and 172c is higher than the refractive index of the second optical path converting member 173. For example, the first optical path converting members 172a, 172b, and 172c may be organic layers or inorganic layers.

A height h2 of the first optical path converting members 172a, 172b, and 172c is not particularly limited as long as the first optical path converting members 172a, 172b, and 172c can change the path of light emitted from the first, second, and third organic light-emitting layers 151, 152, and 153 so that the light can be provided in the vertical direction with respect to the substrate 110.

The second optical path converting member 173 may be disposed to surround the first optical path converting members 172a, 172b, and 172c. For example, the second optical path converting member 173 may be disposed along a plurality of side surfaces of, for example, the first optical path converting member 172c, including the first and second side surfaces 172c1 and 172c2. That is, the second optical path converting member 173 may fill spaces between the planarization layer 171 and the first encapsulation layer 180 where the first optical path converting members 172a, 172b, and 172c are not provided.

In one exemplary embodiment, the second optical path converting member 173 may be an air layer (e.g., a layer formed of air). Accordingly, the refractive index of the second optical path converting member 173 may be about 1 and may thus be lower than the refractive index of the first optical path converting members 172a, 172b, and 172c.

The first encapsulation layer 180 may be disposed on the optical path converter 170. The first encapsulation layer 180 may prevent or substantially prevent moisture and air from the outside from infiltrating into the OLEDs. In one exemplary embodiment, the first encapsulation layer 180 may be a transparent insulating substrate. When the first encapsulation layer 180 is a transparent insulating substrate, the first encapsulation layer 180 may be coupled to the substrate 110 via a separate sealing member.

The path of light emitted from the plurality of organic light-emitting layers, particularly, the third organic light-emitting layer 153 of FIG. 3, will hereinafter be described with reference to FIG. 4.

Figure 4:
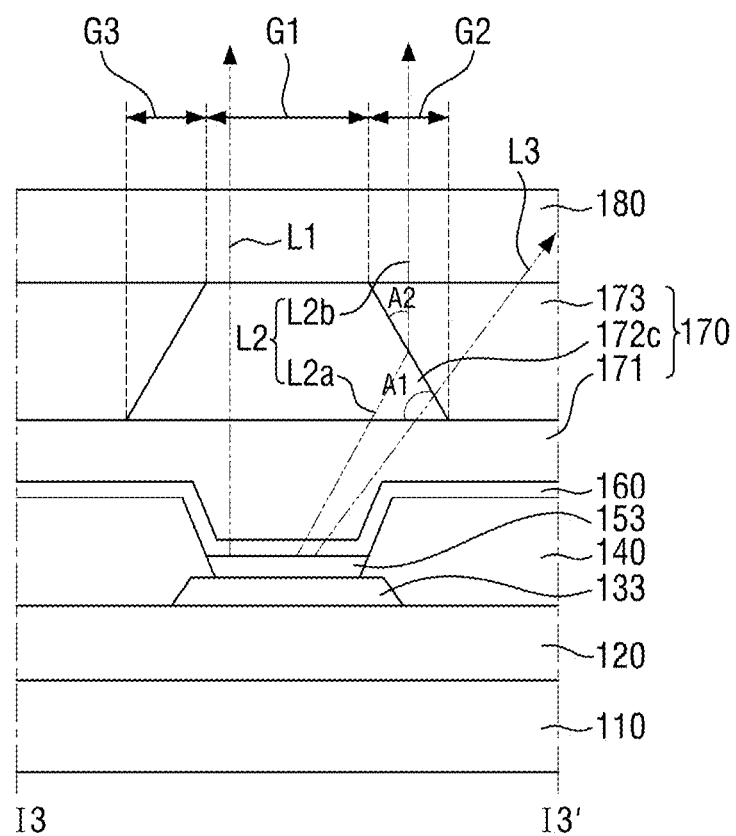
FIG. 4 is a schematic diagram showing the path of light within the organic light-emitting display device according to an exemplary embodiment of the present disclosure.

FIG. 4 is a schematic diagram showing the path of light within the organic light-emitting display device according to an exemplary embodiment of the present disclosure.

Referring to FIG. 4, light emitted from the third organic light-emitting layer 153 may be provided to one of first, second, and third areas G1, G2, and G3. Straight light provided to the first area G1 will hereinafter be referred to as first light L1, and light provided to the second or third area G2 or G3 through optical path conversion performed by the optical path converter 170 will hereinafter be referred to as second light L2.

As already mentioned above, the length l4c of the top surface 172c3 of the first optical path converting member 172c may be greater than the length l3 of the third opening OP3 of the pixel defining film 140, and a pair of opposing sides of the third organic light-emitting layer 153 may both fall within (e.g., be covered by) the top surface 172c3 of the first optical path converting member 172c.

Accordingly, the first light L1, which is emitted from the third organic light-emitting layer 153 in the vertical direction with respect to the substrate 110, can be prevented or substantially prevented from being applied to the first or second side surface 172c1 or 172c2 of the first optical path converting member 172c, and as a result, the path of the first light L1 can be prevented or substantially prevented from being changed by the first optical path converting member 172c.

The path of the second light L2 will hereinafter be described. For convenience, light L2a and light L2b will hereinafter both be referred to as second light.

The second light L2a may be emitted from the third organic light-emitting layer 153 and may be provided to the first side surface 172c1 of the first optical path converting member 172c. As already mentioned above, the refractive index of the first optical path converting member 172c is higher than the refractive index of the second optical path converting member 173. Accordingly, the second light L2a provided to the first side surface 172c1 of the first optical path converting member 172c may be refracted at a predetermined angle so that its path can be changed. The second light L2a with its path changed, i.e., the second light L2b, may be provided in the vertical direction with respect to the substrate 110. If the optical path converter 170 is not provided, third light L3 emitted from the third organic light-emitting layer 153 may be absorbed by other elements and thus may not be able to be emitted outwardly.

That is, the optical path converter 170 may change the path of some of the light emitted from the plurality of organic light-emitting layers and may thus allow the light to be emitted outwardly. As a result, the optical efficiency of the organic light-emitting display device 10 can be improved, and an emission area of the organic light-emitting display device 10 can be enlarged.

A refraction angle A2 of the second light L2 is determined by a first angle A1 of the first optical path converting member 172c. The first angle A1 of the first optical path converting member 172c may be determined such that the path of light emitted from the third organic light-emitting layer 153 can be changed by the first side surface 172c1 of the first optical path converting member 172c for the light to travel substantially vertically with respect to the substrate 110.

Figure 5A:
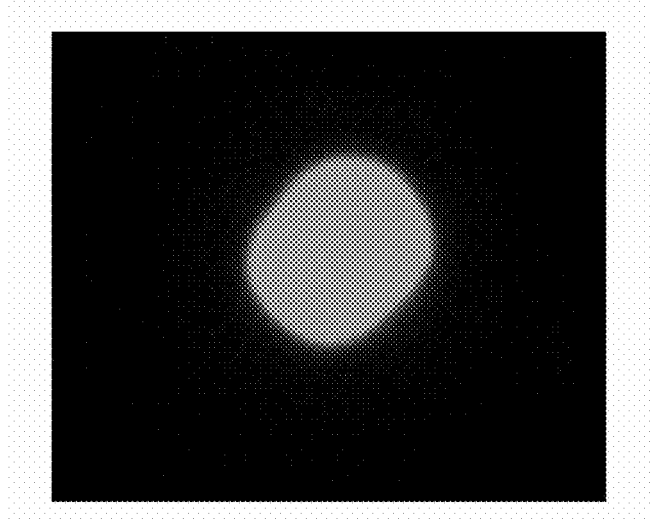
FIGS. 5A and 5B show the enlargement of an emission area of the organic light-emitting display device according to an exemplary embodiment of the present disclosure.
Figure 5B:
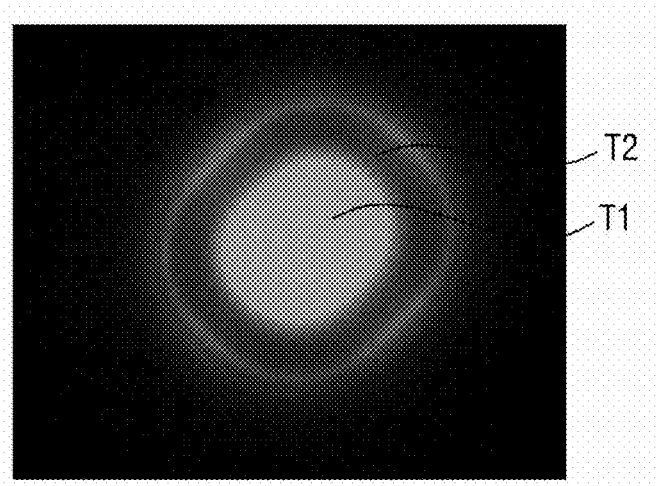
Figure 6:
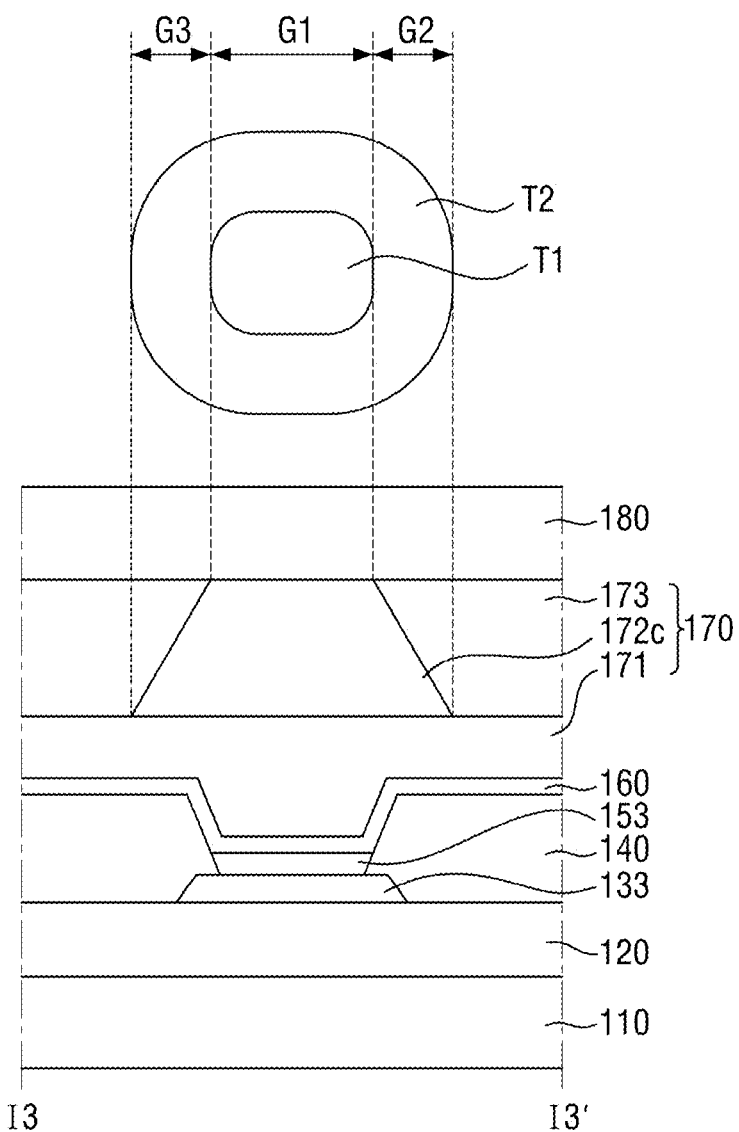
FIG. 6 is a schematic diagram illustrating the emission area of FIG. 5B, which is the emission of the organic light-emitting display device according to an exemplary embodiment of the present disclosure.

FIGS. 5A and 5B show the enlargement of an emission area of the organic light-emitting display device according to an exemplary embodiment of the present disclosure. Specifically, FIG. 5A shows an emission area of an organic light-emitting display device according to a comparative example, which does not include the optical path converter 170 of FIG. 3, and FIG. 5B shows an emission area of the organic light-emitting display device according to an exemplary embodiment of the present disclosure. FIG. 6 is a schematic diagram illustrating an emission area of the organic light-emitting display device according to an exemplary embodiment of the present disclosure, i.e., the emission area of FIG. 5B. FIGS. 5A, 5B and 6 show an exemplary emission area formed by the third organic light-emitting layer 153.

The emission area of FIG. 5B is larger than the emission area of FIG. 5A, and this means that the optical efficiency of the organic light-emitting display device 10 is improved as compared to the organic light-emitting display device according to the comparative example.

The emission area of FIG. 5B includes areas having different luminance. For example, referring to FIGS. 5 and 6, an emission area may be divided into a main area T1 and a peripheral area T2. The main area T1 corresponds to the first area G1, and the peripheral area T2 corresponds to the second and third areas G2 and G3. The luminance of the main area T1 may be higher than the luminance of the peripheral area T2.

The width of the second and third areas G2 and G3 is determined by the first and second side surfaces 172c1 and 172c2 of the first optical path converting member 172c. In one exemplary embodiment, the width of the second and third areas G2 and G3 and the length of the first and second side surfaces 172c1 and 172c2 of the first optical path converting member 172c may be determined such that the occurrence of a blurring phenomenon, which is a phenomenon in which colors from adjacent emission areas overlap, can be prevented or reduced.

Organic light-emitting display devices according to other exemplary embodiments of the present disclosure will hereinafter be described with reference to FIGS. 7 through 11, which are cross-sectional views taken along the line l3-l3' of FIG. 2, avoiding any redundant descriptions of the exemplary embodiment of FIGS. 1 through 6.

Figure 7:
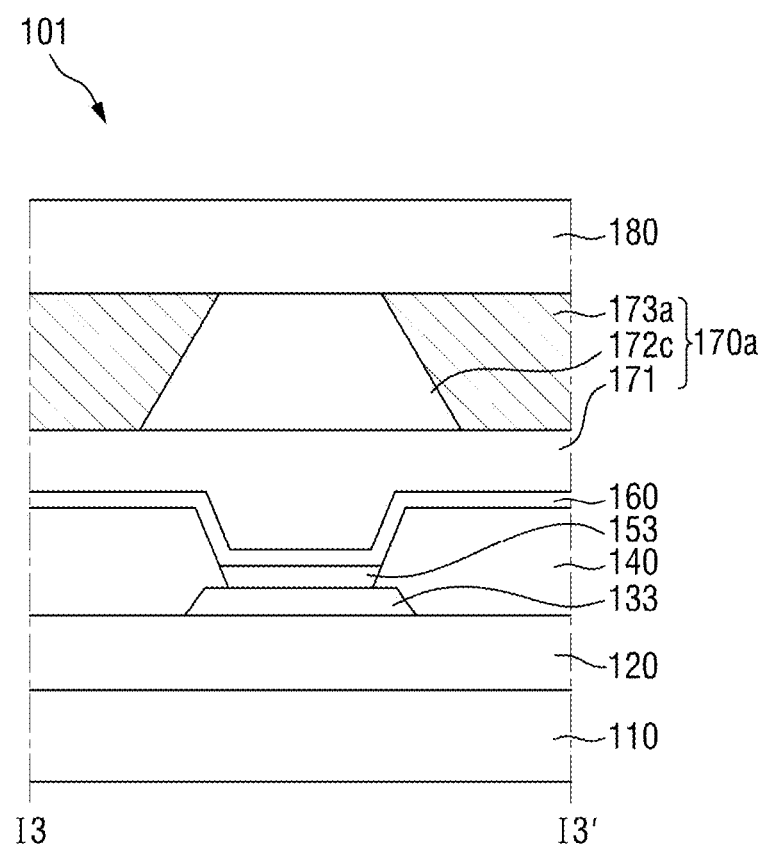
FIGS. 7 through 9 are schematic cross-sectional views of organic light-emitting display devices according to other exemplary embodiments of the present disclosure.

FIG. 7 is a schematic cross-sectional view of an organic light-emitting display device according to another exemplary embodiment of the present disclosure.

Referring to FIG. 7, a display panel 101 may include an optical path converter 170a, which has a second optical path converting member 173a that is formed of an inorganic material or an organic material. That is, the second optical path converting member 173a of FIG. 7 is not an air layer and may be formed by filling spaces between a planarization layer 171 and a first encapsulation layer 180 with an inorganic material or an organic material.

The material of the second optical path converting member 173a is not particularly limited as long as the refractive index of the second optical path converting member 173a is lower than the refractive index of a first optical path converting member 172c.

Figure 8:
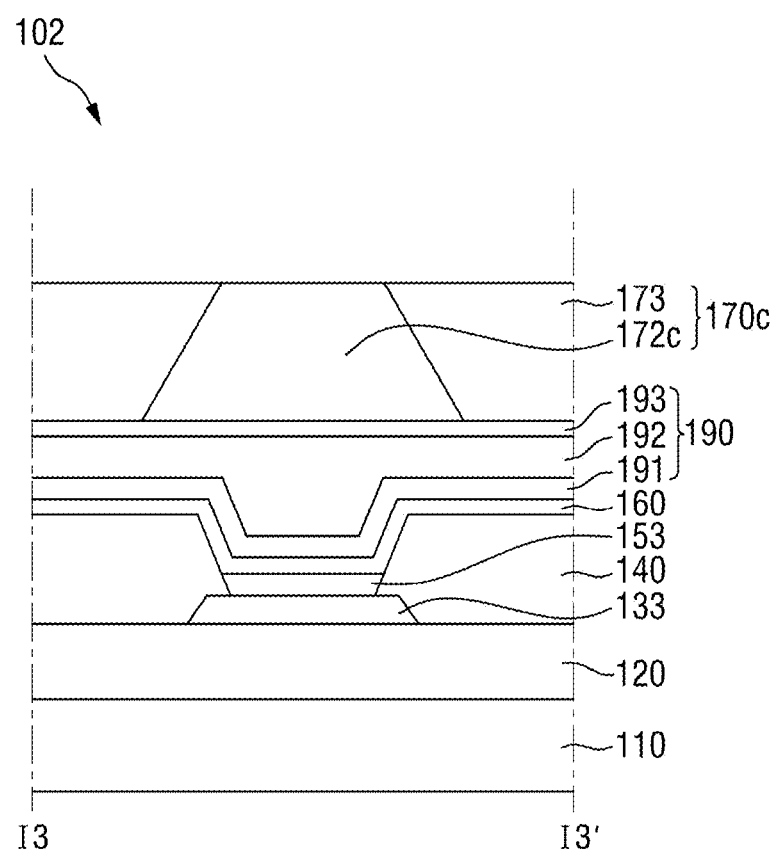

FIG. 8 is a schematic cross-sectional view of an organic light-emitting display device according to another exemplary embodiment of the present disclosure.

Referring to FIG. 8, a display panel 102 differs from the display panel 100 of FIG. 4 in that the first encapsulation layer 180 of FIG. 4 is replaced with a second encapsulation layer 190.

In one exemplary embodiment, the second encapsulation layer 190 may be formed as a multilayer film including at least one organic layer and at least one inorganic layer. In one exemplary embodiment, the second encapsulation layer 190 may include a first inorganic layer 191, which is disposed on a common electrode 160, an organic layer 192, which is disposed on the first inorganic layer 191, and a second inorganic layer 193, which is disposed on the organic layer 192. The first and second inorganic layers 191 and 193 may include at least one selected from the group consisting of $SiO_x$, $SiN_x$, and $SiON_x$.

The organic layer 192 may include at least one of an acrylic resin, a methacrylic resin, polyisoprene, a vinyl resin, an epoxy resin, a urethane resin, a cellulose resin, a siloxane resin, a PI resin, a polyamide resin, and a perylene resin.

In another exemplary embodiment, the second encapsulation layer 190 may include a hexamethyldisiloxane (HMDSO) layer. When the second encapsulation layer 190 includes the HMDSO layer, the organic layer 192, which is disposed between the first and second inorganic layers 191 and 193, may be replaced with the HMDSO layer. In one exemplary embodiment, the HMDSO layer may be formed in the same chamber as the first inorganic layer 191 after the formation of the first inorganic layer 191. Accordingly, the formation of the second encapsulation layer 190 can be simplified.

An optical path converter 170c may be disposed on the second encapsulation layer 190. That is, the display panel 102 differs from the display panel 100 of FIG. 4 in that the optical path converter 170c is disposed on the second encapsulation layer 190.

Figure 9:
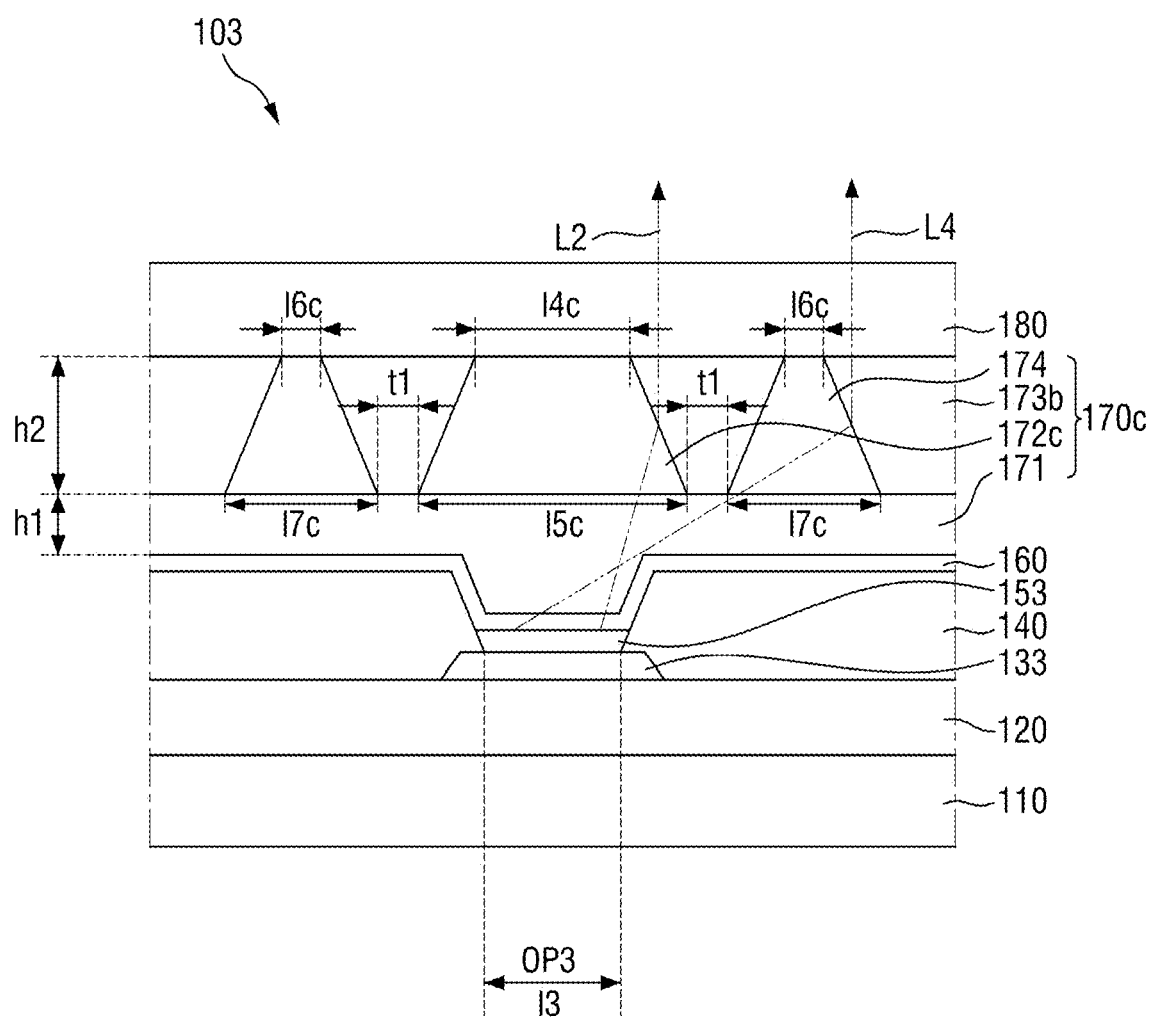
Figure 10:
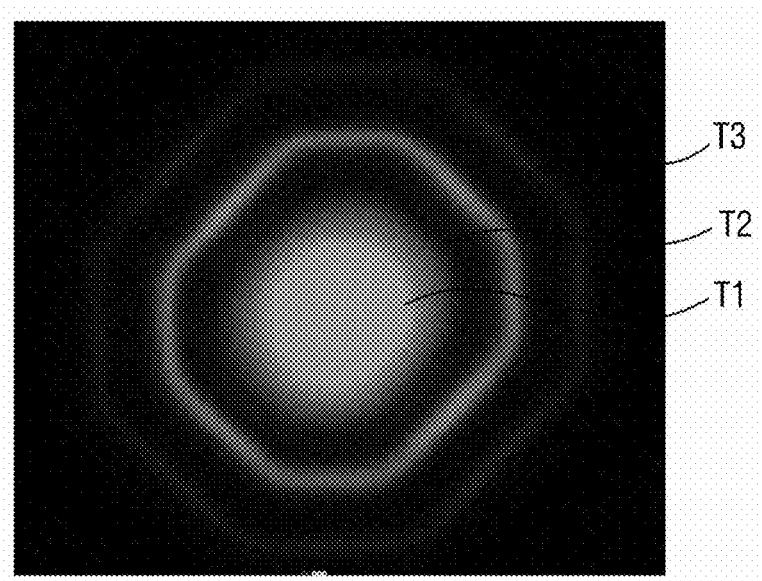
FIG. 10 shows an emission area of the organic light-emitting display device according to the exemplary embodiment of FIG. 9.

FIG. 9 is a schematic cross-sectional view of an organic light-emitting display device according to another exemplary embodiment of the present disclosure. FIG. 10 shows an emission area of the organic light-emitting display device according to the exemplary embodiment of FIG. 9.

Referring to FIGS. 9 and 10, an optical path converter 170c may further include third optical path converting members 174.

The third optical path converting members 174 may be formed to be a predetermined distance apart from a first optical path converting member 172c and to surround the first optical path converting member 172c. For example, the third optical path converting members 174 may be a first distance t1 apart from the first optical path converting member 172c. The first distance t1 is not particularly limited as long as it does not cause a blurring phenomenon.

In one exemplary embodiment, the third optical path converting members 174 may have the same shape as, but a different size from, the first optical path converting member 172c. That is, the third optical path converting members 174 may have a trapezoidal cross-sectional shape. Thus, a length l6c of the top surfaces of the optical path converting members 174 may be smaller than a length l7c of the bottom surfaces of the third optical path converting members 174.

The optical path converter 170c additionally includes the third optical path converting members 174 and can thus change the path of light L4, which is emitted to the outside of the first optical path converting member 172c, so that the light L4 can travel in a vertical direction with respect to a substrate 110. Accordingly, the emission efficiency of the organic light-emitting display device according to another exemplary embodiment of the present disclosure can be improved, and an emission area of the organic light-emitting display device according to another exemplary embodiment of the present disclosure can be enlarged.

Referring to FIG. 10, an emission area may be divided into a main area T1, a first peripheral area T2, and a second peripheral area T3. That is, the emission area of FIG. 10, unlike the emission area of FIG. 5B, may further include the second peripheral area T3.

Figure 11:
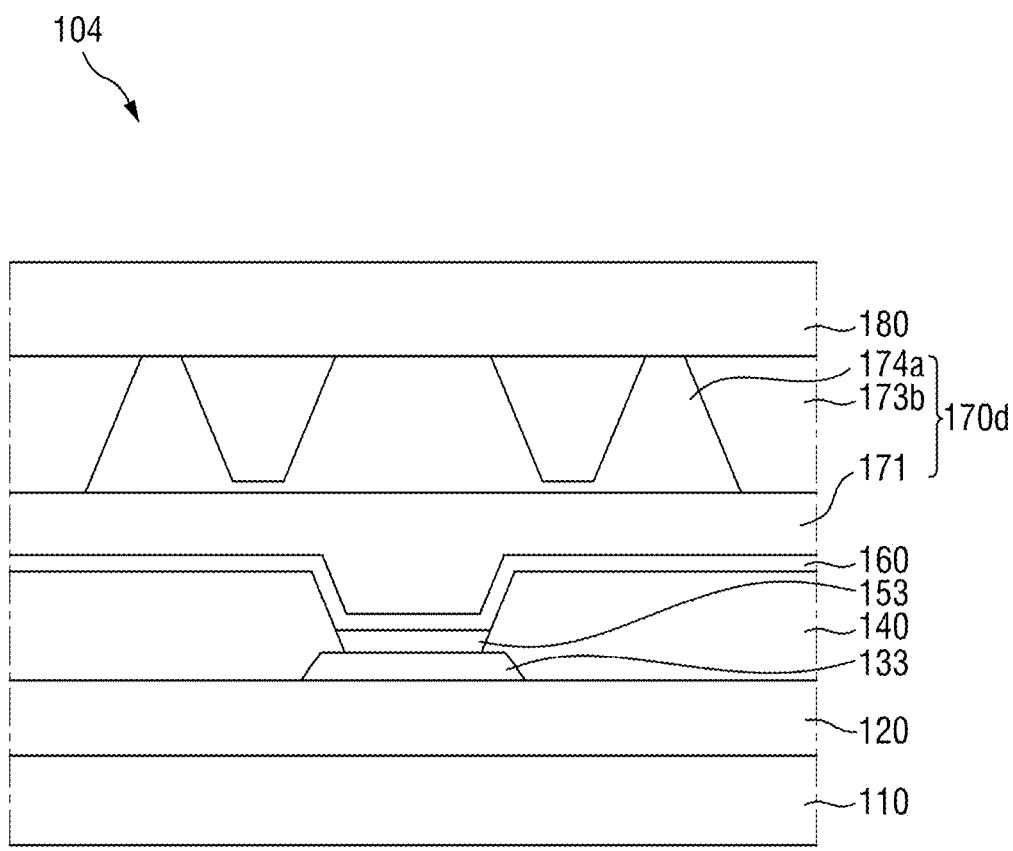
FIG. 11 is a schematic cross-sectional view of an organic light-emitting display device according to another exemplary embodiment of the present disclosure.

FIG. 11 is a schematic cross-sectional view of an organic light-emitting display device according to another exemplary embodiment of the present disclosure.

A display panel 104 of FIG. 11 differs from the display panel 103 of FIG. 9 in that the first optical path converting member 172c and the third optical path converting members 174a of FIG. 9 are connected together to form a single optical path converting member 174a.

Alternatively to what is shown in FIG. 11, the optical path converting member 174a may be connected to other optical path converting members 174a in neighboring pixels.

While the present disclosure has been particularly illustrated and described with reference to exemplary embodiments thereof, it will be understood by those of ordinary skill in the art that various changes in form and detail may be made therein without departing from the spirit and scope of the present invention as defined by the following claims and their equivalents. The exemplary embodiments described herein should be considered in a descriptive sense only and not for purposes of limitation.

What is claimed is:

1. An organic light-emitting display device comprising:
    a substrate;
    a pixel defining film disposed on the substrate and including a first opening;
    a first organic light-emitting layer on the pixel defining film, and at least a portion of the first organic light-emitting layer is disposed on the first opening of the pixel defining film; and
    an optical path converter on the pixel defining film and overlapping with the first organic light-emitting layer, the optical path converter comprising a first optical path converting member having a first refractive index and a second optical path converting member having a second refractive index that is lower than the first refractive index,
    wherein:
    the first optical path converting member includes a first surface, a second surface opposing the first surface of the first optical path converting member and being shorter than the first surface of the first optical path converting member, a first side surface connecting a first side of the first surface and a first side of the second surface of the first optical path converting member, and a second side surface connecting a second side of the first surface and a second side of the second surface of the first optical path converting member,
    the second optical path converting member surrounds the first and second side surfaces of the first optical path converting member, and
    a length of the second surface of the first optical path converting member is greater than a length of the first opening of the pixel defining film.

2. The organic light-emitting display device of claim 1, wherein the first optical path converting member has a trapezoidal cross-sectional shape.

3. The organic light-emitting display device of claim 1, wherein the optical path converter further comprises a planarization layer between the pixel defining film and the first optical path converting member.

4. The organic light-emitting display device of claim 3, wherein a refractive index of the planarization layer is higher than or equal to the first refractive index.

5. The organic light-emitting display device of claim 1, further comprising:
    a second organic light-emitting layer on the substrate and to emit light of a different color from the first organic light-emitting layer,
    wherein:
    the pixel defining film further includes a second opening that at least partially exposes the second organic light-emitting layer and has a different length from the first opening,
    the optical path converter further comprises a third optical path converting member on the pixel defining film and overlapping with the second organic light-emitting layer, the third optical path converting member having the first refractive index,
    the third optical path converting member includes a first surface, a second surface opposing the first surface of the third optical path converting member and being shorter than the first surface of the third optical path converting member, a first side surface connecting a first side of the first surface and a first side of the second surfaces of the third optical path converting member, and a second side surface connecting a second side of the first surface and a second side of the second surface of the third optical path converting member, and the length of the second surface of the first optical path converting member is different from a length of the second surface of the third optical path converting member.

6. The organic light-emitting display device of claim 1, further comprising:
an encapsulation layer on the optical path converter,
wherein the encapsulation layer is a glass insulating substrate.

7. The organic light-emitting display device of claim 1, further comprising:
an encapsulation layer between the pixel defining film and the first optical path converting member,
wherein the encapsulation layer comprises an organic layer and an inorganic layer.

8. The organic light-emitting display device of claim 1, wherein the second optical path converting member is an air layer.

9. The organic light-emitting display device of claim 1, wherein the second optical path converting member is in direct contact with the first and second side surfaces of the first optical path converting member.

10. The organic light-emitting display device of claim 1, wherein the optical path converter further comprises a third optical path converting member, the third optical path converting member surrounding the first optical path converting member on an outside of the first optical path converting member.

11. The organic light-emitting display device of claim 10, wherein the third optical path converting member has a trapezoidal cross-sectional shape.

12. An organic light-emitting display device comprising:
a substrate;
a pixel defining film disposed on the substrate and including a first opening;
an organic light-emitting layer on the pixel defining film, and at least a portion of the organic light-emitting layer is disposed on the first opening of the pixel defining film;
and
an optical path converter on the pixel defining film and overlapping with the organic light-emitting layer, the optical path converter comprising a first optical path converting member having a trapezoidal cross-sectional shape and a second optical path converting member surrounding side surfaces of the first optical path converting member, wherein:
a refractive index of the first optical path converting member is higher than a refractive index of the second optical path converting member, and
a length of a top surface of the first optical path converting member is greater than a length of the first opening of the pixel defining film.

13. The organic light-emitting display device of claim 12, wherein
the first optical path converting member includes a bottom surface facing the top surface of the first optical path converting member and being longer than the top surface of the first optical path converting member, a first side surface connecting a first side of the top surface and a first side of the bottom surface of the first optical path converting member, and a second side surface connecting a second side of the top surface and a second side of the bottom surface of the first optical path converting member, and
the second optical path converting member surrounds the first and second side surfaces of the first optical path converting member.

14. The organic light-emitting display device of claim 12, wherein the optical path converter further comprises a planarization layer between the pixel defining film and the first optical path converting member.

15. The organic light-emitting display device of claim 14, wherein the planarization layer comprises an inorganic layer.

16. The organic light-emitting display device of claim 12, further comprising:
an encapsulation layer on the optical path converter,
wherein the encapsulation layer is a glass insulating substrate.

17. The organic light-emitting display device of claim 12, further comprising:
an encapsulation layer between the pixel defining film and the first optical path converting member,
wherein the encapsulation layer comprises an organic layer and an inorganic layer.

18. The organic light-emitting display device of claim 12, wherein the optical path converter further comprises a third optical path converting member surrounding the first optical path converting member on an outside of the first optical path converting member.

19. The organic light-emitting display device of claim 18, wherein a refractive index of the third optical path converting member is higher than the refractive index of the second optical path converting member.

20. The organic light-emitting display device of claim 18, wherein the third optical path converting member has a trapezoidal cross-sectional shape.

\* \* \* \* \*